Figure 4:
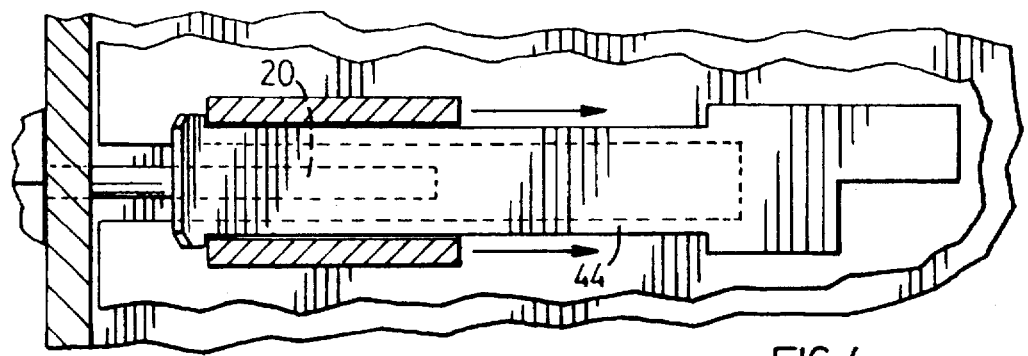

United States Patent [19]

Romerein et al.

[11] Patent Number: 5,750,929
[45] Date of Patent: May 12, 1998

[54] TERMINAL ASSEMBLY FOR A CATV

[75] Inventors: Robert L. Romerein; David B. Crowhurst; Christopher A. Allinson, all of Lindsay, Canada

[73] Assignee: J. E. Thomas Specialties Limited, Lindsay, Canada

[21] Appl. No.: 731,483

[22] Filed: Oct. 16, 1996

[30] Foreign Application Priority Data

Oct. 18, 1995 [CA] Canada ..................... 2160851

[51] Int. Cl.⁶ ..................................... H01R 7/14
[52] U.S. Cl. ............................ 174/88 C; 439/811
[58] Field of Search ..................... 174/88 C, 84 C, 174/84 S, 71 C, 250; 439/811, 812, 63, 579

[56] References Cited

U.S. PATENT DOCUMENTS

| | | |
|---|---|---|
| 970,087 | 9/1910 | Murray ..................... 439/811 |
| 2,532,068 | 11/1950 | Larsen ..................... 439/811 |
| 2,809,363 | 10/1957 | Schertel et al. ........... 439/812 |
| 3,864,005 | 2/1975 | Klein ........................ 439/812 |
| 4,027,940 | 6/1977 | Mazzeo ..................... 439/812 |
| 4,990,109 | 2/1991 | Romerein et al. ......... 439/801 |

*Primary Examiner*—Kristine L. Kincaid
*Assistant Examiner*—Joseph Waks
*Attorney, Agent, or Firm*—Robert L. Westell; Dowell & Dowell, P.C.

[57] ABSTRACT

A terminal assembly for a CATV RF circuit is located on a circuit board with a slot open towards a port through which projects a coaxial cable pin. The board is located below the pin and the slot allows travel of the board vertically therepast. A conducting blade connected to RF circuitry on the board projects over and parallel to the pin and a yoke, slidable on the blade, slides from a retracted position where the board may be lifted past the pin and an extended position, where it encircles the pin and blade and clamps them together.

3 Claims, 2 Drawing Sheets

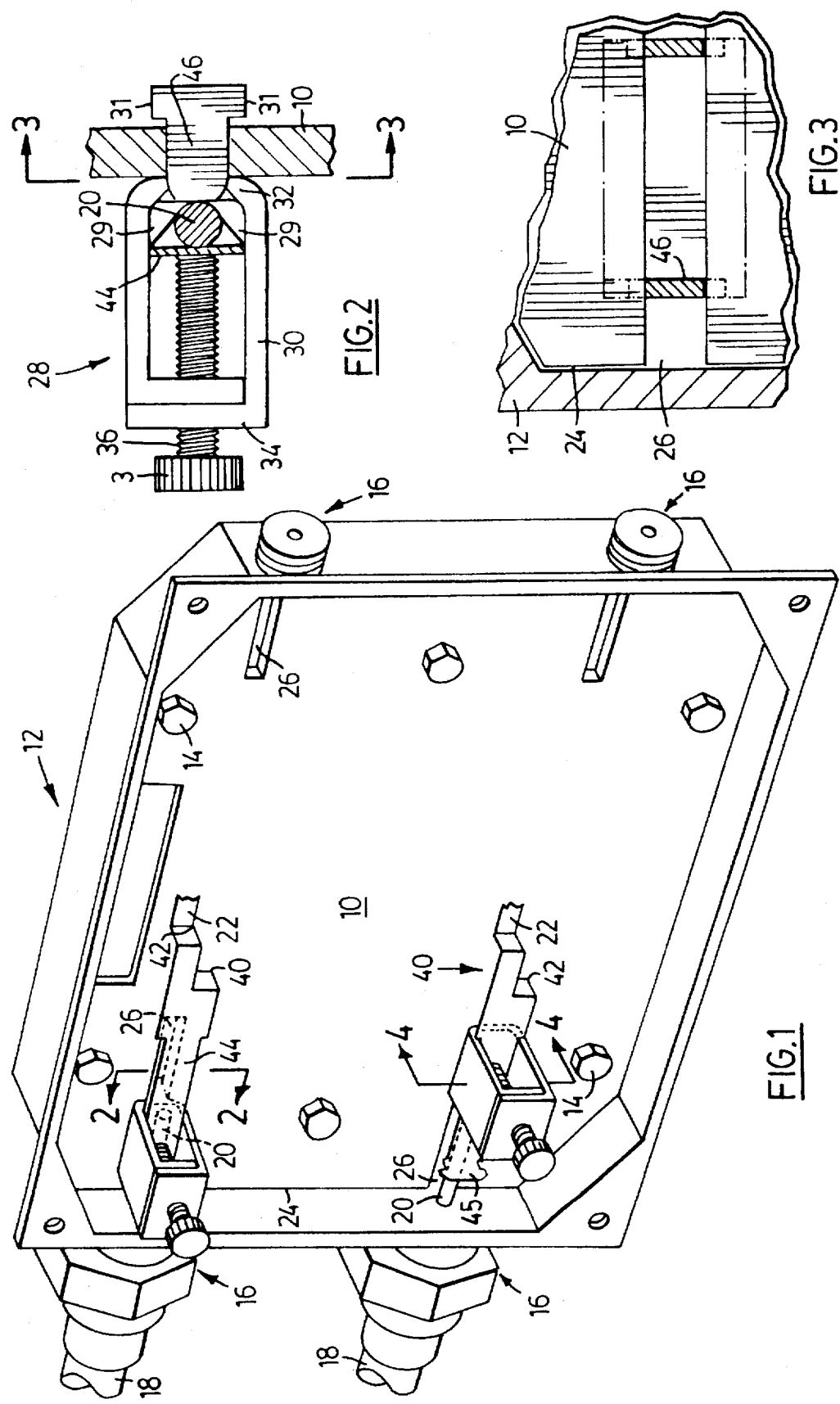

TERMINAL ASSEMBLY FOR A CATV

BACKGROUND OF THE INVENTION

This invention relates to terminal means for electrically connecting the pin of the central conductor of a coaxial cable to electrical circuitry on an insulating circuit board.

The insulating circuit board will usually be a printed circuit board.

The invention will have principal application in cable television (CATV) circuitry but is by no means limited thereto.

In CATV and similar applications, components such as directional couplers, line splitters, power inserters, amplifiers, taps, etc. have their circuits on a printed circuit board of insulating material contained in a metal housing with lid. With one or more coaxial cables mechanically attached to the housing and the central conductors thereof projecting through a side wall thereof, the central coaxial conductor is connected to the circuitry on the circuit board while the outer conductor is connected to the metal housing. In case of malfunction, it is desireable that a serviceman be able to easily remove the cover and then the circuit board and replace it with a new circuit board. When the upper limit of the bandwidth was 700 Megahertz (MHz) or lower, the circuit board could be made considerably smaller than the inner dimensions of the metal housing and disconnecting and connecting the central coaxial conductor from the circuit board could be performed relatively easily by a variety of means because of the relatively large clearance between the board and the inner dimensions of the housing. However with bandwidths above 700 MHz and, in some cases, up to 1000 MHz(1 Gigahertz (GHz))or higher, the effect of the ambient physical components on the circuit parameters has rendered it desireable that the dimensions of the circuit parameters and the dimensions of the circuit board approach as closely as reasonably possible to inner housing dimensions. It is therefore desireable that, to replace a malfunctioning circuit board, the board be electrically disconnectable and removable directly upwardly out of the casing (and perpendicularly to the plane of the board and the pins of the central conductors which extend inwardly through the housing side walls). The replacement board equally should be designed to be moved downwardly perpendicular to the plane of the board and the pin axis; and, in situ, easily connected to the pin.

The terms 'top' and 'bottom' and 'upward' and 'downward' relate to the convention used herein that the lid is above or on the top upper side of the housing and this convention is adhered to herein even though in some applications the housing is oriented so that the lid may be horizontally, downwardly or otherwise disposed relative to the housing.

By 'pin' herein I mean the stub or free end of a central coaxial conductor, projecting beyond the remainder of the conductor, used for connecting the central conductor to a circuit component.

SUMMARY OF THE INVENTION

It is an object of the inventions to provide a terminal for connecting the central pin of a coaxial conductor to the circuit on a circuit board which will allow disconnection of a circuit board from, and connection of a circuit board to, the central conductor without movement of the circuit board in a direction other than perpendicular to the plane of the circuit board, that is only upwardly and downwardly, where the circuit board is mounted or to be mounted, in a housing.

In accord with the invention a circuit board has a slot extending to an edge at which a coaxial cable pin is to be connected, and the slot is dimensioned to pass the pin, moving up or down when the circuit board is mounted or to be mounted (usually in a CATV housing). A blade mechanically connected to the circuit board and electrically connected or connectable to circuitry on the board is located to overlie the pin and be generally in alignment therewith when the board is so mounted. A yoke is slidable on said blade from a retracted to an extended position. Stop means on the blade preferably stops the yoke at extended position. In extended position the yoke surrounds the blade and the pin. In the retracted position the yoke is clear of the pin. In the extended position clamping means on the yoke may be actuated to clamp the blade to the pin to provide a good electrical connection. In the retracted position the board and terminal may be lifted upwardly out of the housing. The slot in the board allows it to pass upwardly past the pin.

Preferably the clamping means is a screw threaded in an upper extent of the yoke, located when tightened to bear on the upper side of the blade while the lower extent of the yoke presses upwardly against the pin. The action is to draw the pin, relatively, into contact with the blade to clamp blade and pin in good electrical contact.

Preferably, the yoke is provided with a lower portion, slidable in the slot in the extended, and preferably also, in the retracted position. The yoke portion slidable in the slot acts to key the yoke against rotation particularly when the clamping means is being actuated or the clamping screw is being tightened.

Preferably, the yoke lower portion slidable in the slot extends onto two tabs which are positioned below the slot and extending on each side thereof. These act to maintain the yoke against pivotting about the axis of the slot and about an axis transverse to the slot and parallel to the board and thus sustain the yoke against rotation above these axes when the screw is turned.

Preferably, the opening in the yoke using the screw for clamping is shaped to be tapering downwardly opposite the screw to form an upwardly facing 'nest' for the pin as it is, relatively, brought into clamping position.

By 'blade' herein I include any longitudinally extending member shaped and locatable to be clamped to the pin when the clamping means is actuated. Although the blade is preferably of flat thin section as shown in the drawings, it could be concave downward to form a nest for the pin or any other shape which may be clamped to the pin by the clamping means.

The terminal described herein is of particular advantage for use with a housing where width (the dimension transverse to the axis of the pins) is at a minimum. In this regard the terminal of this invention has advantages over the terminal shown in U.S. Pat. No. 4,990,109 to Romerein et al.

Figure 5:
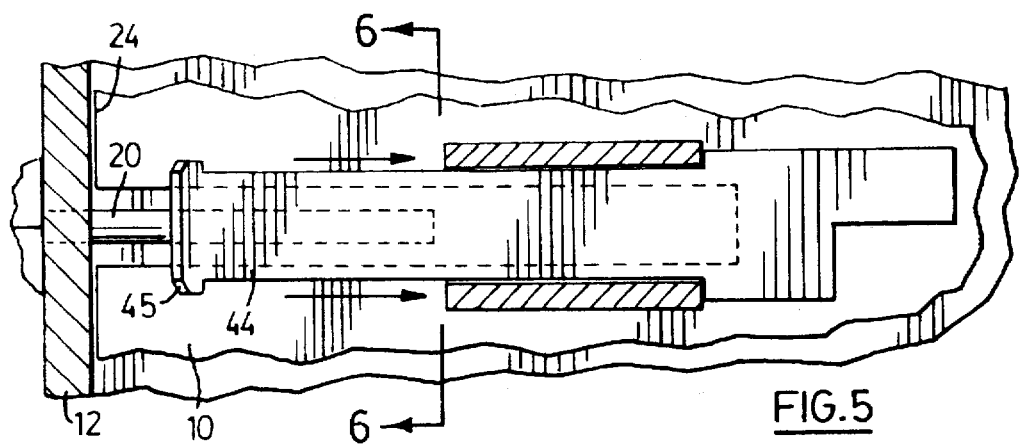
Figure 6:
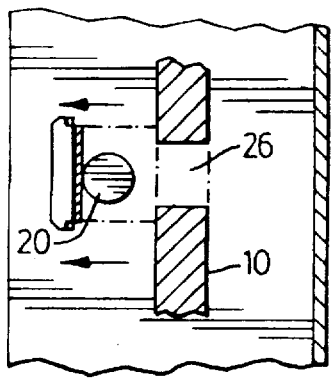
Figure 7:
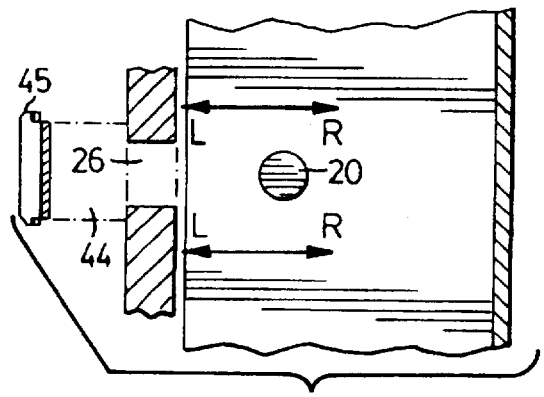

In the drawings which illustrate a preferred embodiment of the invention:

FIG. 1 is a perspective view of a CATV housing with board and terminals in place, FIG. 2 is a section through the terminal clamping means, FIG. 3 is a view along the lines 3—3 of FIG. 2, FIG. 4 a section along the lines 4—4 of FIG. 1, FIG. 5 is a view similar to FIG. 4 but showing the yoke in retracted position, FIG. 6 a view along the lines 6—6 of FIG. 5, and FIG. 7 view similar to FIG. 6 but showing the circuit board being lifted out of the casing.

In the drawings a circuit board 10 may be mounted in a housing 12 by bolts 14. The housing will contain two or more ports 16, at two of which coaxial cables 18 will be attached in a manner well known to those skilled in the art. Thus, although the board shown will use the two left hand ports 16 another board, with a different RF circuit, not shown, may use a different pair of ports 16. The housing lid is not shown as well known to those skilled in the art and forming no part of the present invention. When the coaxial cable is so attached the pin 20 of the coaxial cable, which is an electrical extension of the center conductor of a coaxial cable, projects into the housing, as shown, for connection to RF circuitry on the circuit board. (The circuit is not shown in full herein, the portion 22 is part of the circuitry (the remainder not shown).

A connection of the pin to the circuitry, represented by portion 22, a terminal is provided, and the board shaped as described herein.

When the board is mounted in the housing by bolts 14 it is located just below the level of board 10. The pin will extend over the edge 24 of the board. Accordingly, to allow vertical removal or installation of the board with the pins 20 of one or two coaxial cables in place; the edge 24 is provided with slots 26 of greater width and depth than the projection of pin 20 inward of edge 24 and vertically disposed thereabove when the board is mounted on the housing. With such slots a board may be moved vertically outward or inward of the casing past installed pins.

The terminal for connecting the pin with circuitry on the board will now be described.

The board 10 is provided with circuitry, not shown, terminating at a conducting foil (or conductor) 22 adjacent each of two ports 16. In electrical connection with foil 22 is the terminal mount 40 which is Preferably rivetted or soldered at 42 to board 10 and extends from mounting 42 with a jog so that its outer extent, blade 44, is spaced from and approximately parallel to the board. A blade 44 therefore overlies each slot 26 corresponding to a terminal. The blade 44 is spaced to overlie, with only a small clearance, pins 20 when the latter project into the housing and the board is mounted in the housing.

The terminal yoke 28 preferably is made from a single flat blank of stamped metal stock, bent to provide side walls 30, bottom wall 32 and top wall 34. A threaded vertical bore in top wall 34 mounts a set screw 36 whose head 37 is manually adjustable or shaped (not shown) for adjustment by a screwdriver or wrench. Blade 44 is, at its free end provided with widened end tabs 45 which provide a stop to the movement of the yoke along the blade toward the nearest housing wall. This stop sets the position of the yoke relative to the nearest housing wall, to set the desired impedance between the yoke which will be excited by the RF signal which goes from pin 20 to blade 44 or vice versa, and the adjacent housing wall which is excited by ground currents. In order to install the yoke on the blade, it is placed thereon before the mount 40 is attached to the board, or the blade is made as a separate member from the mount 42, and the yoke attached thereto before the blade 44 is attached to mount 42.

The dimensions of the space surrounded by the yoke are such as to receive overlapping extents of the blade 40 and the pin 20, when the screw 36 is retracted.

At the right hand end of the housing of FIG. 1 are shown unused ports 16 and slots 26.

The yoke is preferably provided with a lower portion adapted to slide in slot 26 which lower portion is shaped to key the yoke against rotation about an axis perpendicular to the board as well as axis parallel to the pin. Preferably the lower portion is formed by two tabs as later described.

Midway along the yoke 28, measured in the direction of insertion of pin 20 (from one direction) and blade 44 (from the other direction), nesting tabs 29 are bent in near the bottom of the yoke side wall, to form a downwardly tapering (upwardly facing) nest when viewed in the slot direction (i.e. as viewed in FIG. 2) which will center the pin as it is clamped to blade extent 44. The downwardly tapering nest may of course be formed other than by tabs 29.

A downward projection, embodied herein by two keying tabs 46 is provided on yoke 28. These tabs 46 are dimensioned to slide in a slot 26 and act to 'key' the yoke against rotation about blade 44 and pin 20 so that the yoke remains in its correction orientation. This is particularly important when the set screw 36 is to be tightened.

Tabs 29 are preferably fixed even more secrely against rotation by providing sub tabs 31 which extend on each side of tabs 29 beyond the slot 26 sides in plan view just below the bottom of board 10. The tabs aid in restraining 'tipping' of the yoke about axes parallel to the pin. And since there are two sub tabs they also retain 'tipping' of the yoke about an axis perpendicular to the pin and parallel to the board.

Thus the yoke, with set screw 36 retracted, is movable between a retracted position where the yoke is clear of the pin (FIG. 5) and an extended position (see FIG. 4, FIG. 1 and FIG. 2), where it may clamp the blade to the pin.

In one mode of operation, starting with the pins 20 in place and without a board 10 in the housing (FIG. 7), the yokes 28 are placed in retracted position (FIG. 5). The board is then lowered into place (direction R in FIG. 7) with the slots 26 passing about pins 20. Bolts 14 are then inserted and tightened to mount the board 10 in position in the housing. The yoke, with screw 36 retracted, is then slid along the blade 10, about pin 20 to extended position set by end tabs 31, FIGS. 4,2 and 1. The set screw 26 is then tightened to clamp the pin 20 to extent 44. When this is done the board circuitry 22 is connected to pins 20 and the distribution system and cable is electrically connected to the circuit board circuitry (not shown) connected to circuit portion 22.

It is noted that there is a small relative movement required between pin 20 and blade 40 to achieve this clamping. With a small initial clearance between pin 20 and blade 44 and a slight flexibility in the board 10 mount for blade 40 this is normally easily achieved without special design. If the clearance requires it or there is a concern about strain on the parts, the blade 44 may be made sufficiently flexible to allow flexure under the pressure of set screw 26 to achieve the clamped position.

With the board terminals clamped to the pins, if it is desired to remove a faulty board, the screws are loosened and the yokes moved to retracted position. The bolts 14 holding the board to the housing are removed. The board may then be lifted out of the casing (arrows L of FIG. 7) and replaced as previously described.

In another mode of operation with the board in place, and the terminal blade clamped to the coaxial pin, it may be desired to remove one or both coaxial cables. To do this the relevant set screws 36 are loosened and the yoke slid to retracted position (FIG. 5). The coaxial cable may then be detached from the housing in a manner well known to those skilled in the art and the cable (and pin 20) withdrawn.

With the yoke retracted as described in the previous paragraph, and no coaxial cable connected, such a cable can then be connected by insertion of the pin below and alongside the blade, as the cable is attached in a manner well known to those skilled in the art. The yoke may them be slid over the juxtaposed pin and blade and the set screw tightened to clamp them together.

We claim:

1. A terminal for electrical connection to a central pin of a coaxial cable comprising:

a blade extending to a blade free end, a board of insulating material having said blade mounted thereon and spaced thereabove to admit the pin between said blade and said board, said pin extending to a pin free end, a slot extending to an edge of said board arranged to be generally aligned with and underlie said pin, means for positioning said blade to overlie said pin in an overlap position and in a generally parallel relationship thereto with said blade and pin free ends oppositely directed, a yoke defining an opening, said yoke being shaped to surround said blade and said pin in overlap position, said yoke being moveable between an extended position where it surrounds said pin as well as said blade and a retracted position where it surrounds only said blade, clamping means on said yoke operable to clamp said blade to said pin in said extended position, wherein a lower part of said yoke is slidable in said slot, wherein keying tabs on said yoke extend through said slot and include sub tabs which extend on each side of the keying tabs to underlie the board when said keying tabs extend through said slot.

2. In combination, a housing with a port for attachment of a coaxial cable, when said cable has a pin extent projecting into said housing, a circuit board mounted in said housing having an edge below said pin, a slot in said circuit board dimensioned to allow an upward removal of said board past said pin extent, a blade mounted on said board extending toward said port to overly at least a portion of said pin extent, a yoke surrounding and slidable on said blade and moveable between an extended position where said yoke encircles said pin and said blade, and a retracted position where said yoke encircles only said blade, wherein a lower part of said yoke is slidable in said slot when said yoke is in the extended position, wherein keying tabs on said yoke are slidable in said slot and sub tabs on each of said keying tabs, in said extended position, underlie the board on each side of the slot.

3. A circuit board having an edge, a slot in said board extending inwardly from said edge and dimensioned, on movement perpendicular to said board, to pass about a pin extent, a blade mounted on said board extending toward said edge over said slot, a yoke slidable on said blade from an extended position where it would encircle said pin extent to a retracted position where it would not encircle said pin extent, means on said yoke for clamping said pin to said blade in the extended position of said yoke, wherein said yoke has keying tabs which ride in said slot, and each of said keying tabs has sub tabs which underlie the board adjacent said slot.

* * * * *